(12) United States Patent
Königer et al.

(10) Patent No.: US 11,841,620 B2
(45) Date of Patent: Dec. 12, 2023

(54) METHOD OF ASSEMBLING A FACET MIRROR OF AN OPTICAL SYSTEM

(71) Applicant: Carl Zeiss SMT GmbH, Oberkochen (DE)

(72) Inventors: Andreas Königer, Aalen (DE); Ulrich Müller, Aalen (DE); Daniel Guhr, Steinheim am Albuch (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/989,477

(22) Filed: Nov. 17, 2022

(65) Prior Publication Data

US 2023/0161266 A1     May 25, 2023

(30) Foreign Application Priority Data

Nov. 23, 2021    (DE) .......................... 102021213168.9

(51) Int. Cl.
    *G03F 7/00*             (2006.01)

(52) U.S. Cl.
CPC ........ *G03F 7/7055* (2013.01); *G03F 7/70075* (2013.01); *G03F 7/7085* (2013.01); *G03F 7/70116* (2013.01); *G03F 7/70975* (2013.01)

(58) Field of Classification Search
CPC .............. G03F 7/7055; G03F 7/70075; G03F 7/70116; G03F 7/7085; G03F 7/70975; G03F 7/70; G03F 7/70083; G03F 7/70091; G03F 7/70125; G03F 7/70133; G03F 7/70141; G03F 7/7015–70183; G03F 7/70191; G03F 7/702; G03F 7/70208; G03F 7/70233; G03F 7/70258; G03F 7/70291; G03F 7/70483–70504; G03F 7/70516; G03F 7/70558; G03F 7/70583; G03F 7/70591; G03F 7/706; G03F 7/708;

(Continued)

(56) References Cited

U.S. PATENT DOCUMENTS

| 6,573,978 | B1 | 6/2003 | McGuire |
| 11,169,445 | B2 | 11/2021 | Bieling et al. |

(Continued)

FOREIGN PATENT DOCUMENTS

| DE | 10 2008 009 600 A1 | 8/2009 |
| DE | 10 2012 209 412 A1 | 12/2013 |

(Continued)

OTHER PUBLICATIONS

European Search Report for corresponding Appl No. EP 22208544, dated Apr. 24, 2023.

*Primary Examiner* — Christina A Riddle
(74) *Attorney, Agent, or Firm* — Fish & Richardson P.C.

(57) ABSTRACT

A method of assembling a facet mirror of an optical system, in which facets of the facet mirror are imaged onto a field plane of the optical system, includes: a) determining positions of the facets of the facet mirror relative to interfaces of the facet mirror, with the aid of which the facet mirror is able to be connected to a support structure; b) calculating an actual position of an object field of the optical system arising for the facet mirror in the field plane; and c) arranging spacers between the interfaces and the support structure so that the object field in the field plane is brought from the calculated actual position to a target position.

20 Claims, 8 Drawing Sheets

(58) Field of Classification Search
CPC ............ G03F 7/70808; G03F 7/70825; G03F 7/70833; G03F 7/7095; G03F 7/70958; G03F 7/70908–70941; G01M 11/005; G02B 27/62
USPC ........................ 355/18, 30, 46, 52–55, 66–77
See application file for complete search history.

(56) References Cited

U.S. PATENT DOCUMENTS

| | | |
|---|---|---|
| 2005/0174650 A1* | 8/2005 | Melzer .................... G03F 7/702 359/627 |
| 2006/0132747 A1 | 6/2006 | Singer et al. |
| 2008/0123807 A1* | 5/2008 | Warm ................. G03F 7/70075 378/34 |
| 2013/0100429 A1* | 4/2013 | Fiolka ................. G03F 7/70141 359/850 |
| 2018/0074303 A1 | 3/2018 | Schwab |
| 2018/0373158 A1 | 12/2018 | Baier et al. |
| 2021/0255554 A1 | 8/2021 | Pollak et al. |
| 2021/0294222 A1 | 9/2021 | Petri et al. |
| 2022/0283503 A1 | 9/2022 | Dorn et al. |

FOREIGN PATENT DOCUMENTS

| | | | |
|---|---|---|---|
| DE | 10 2017 220 586 A1 | 5/2019 | |
| DE | 10 2018 220 565 A1 | 6/2020 | |
| DE | 10 2019 218 925 A1 | 6/2021 | |
| DE | 10 2021 201 026 A1 | 9/2021 | |
| EP | 1 614 008 B1 | 1/2006 | |
| EP | 3330762 A1 * | 6/2018 | ............. G02B 17/06 |

* cited by examiner

METHOD OF ASSEMBLING A FACET MIRROR OF AN OPTICAL SYSTEM

CROSS-REFERENCE TO RELATED APPLICATIONS

This application claims benefit under 35 U.S.C. § 119 to German Application No. 10 2021 213 168.9, filed Nov. 23, 2021. The contents of this application are hereby incorporated by reference in their entirety.

FIELD

The present disclosure relates to a method of assembling a facet mirror of an optical system.

BACKGROUND

Microlithography is used for producing microstructured component elements, such as for example integrated circuits. The microlithography process is performed using a lithography apparatus, which has an illumination system and a projection system. The image of a mask (reticle) illuminated via the illumination system is in this case projected via the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, EUV lithography apparatuses that use light with a wavelength in the range from 0.1 nm to 30 nm, for example 13.5 nm, are currently under development. In the case of such EUV lithography apparatuses, because of the high absorption of light of this wavelength by most materials, reflective optical units, that is to say mirrors, are typically used instead of—as previously—refractive optical units, that is to say lens elements.

The illumination system may comprise a first facet mirror, for example a field facet mirror, and a second field facet mirror, for example a pupil facet mirror, which images facets of the first facet mirror into a field plane in which the mask has been placed. It may be desirable to swap the first facet mirror after the lithography apparatus has been in operation for a certain amount of time. By way of example, a tin contamination originating from an EUV light source may make it desirable to swap the first facet mirror. This "mirror swap" or "swap" may lead to the facets of the swapped first facet mirror being offset in relation to the facet mirror to be swapped. This may have as a consequence an unwanted displacement of an object field in the field plane. It is desirable to prevent this.

SUMMARY

The present disclosure seeks to provide an improved method of assembling a facet mirror.

Accordingly, a method of assembling a facet mirror of an optical system is proposed, in which facets of the facet mirror are imaged onto a field plane of the optical system. The method comprises the following steps: a) determining positions of the facets of the facet mirror relative to interfaces of the facet mirror, with the aid of which the facet mirror is able to be connected to a support structure, b) calculating an actual position of an object field of the optical system arising for the facet mirror in the field plane, and c) arranging spacers between the interfaces and the support structure so that the object field in the field plane is brought from the calculated actual position to a target position.

As a result of a suitable arrangement and selection of the spacers allowing the object field in the field plane to be brought into the target position, it is possible to dispense with a complicated adjustment of other optical elements or mirrors of the optical system.

For example, the optical system is an illumination optical unit or part of an illumination optical unit of a projection exposure apparatus for EUV lithography. The optical system may comprise any desired number of optical elements. By way of example, the optical system comprises a first facet mirror or field facet mirror and a second facet mirror or pupil facet mirror. In this case, the second facet mirror images facets, for example field facets, of the first facet mirror onto the field plane. The present method relates for example to the assembly or a swap of the first facet mirror or field facet mirror. That is to say the facet mirror may also be referred to as field facet mirror. Consequently, in the present case, the terms "facet mirror" and "field facet mirror" are interchangeable as desired in relation to the method. The facet mirror can comprise a multiplicity of facets, for example field facets. By way of example, the facet mirror may comprise approximately 300 facets. Each individual facet can be tiltable.

The field plane may also be referred to as image plane. Arranged in the field plane is a photomask or a reticle, the structure of which is imaged onto a wafer or the like with the aid of a projection optical unit downstream of the optical system. As mentioned previously, the method can be suitable for swapping a field facet mirror of the optical system or illumination optical unit. However, the method may alternatively also be used for any other optical element and, for example, for any other facet mirror.

In the present case, the "position" of the facets relative to the interfaces should be understood to mean, for example, the coordinates of the facets relative to the interfaces in a coordinate system spanned by an x-direction, a y-direction and a z-direction. By way of example, "relative to one another" in the present case means that the coordinates of each facet are known in relation to each interface. The facet mirror can be coupled to the support structure with the aid of the interfaces. By way of example, the support structure can be what is known as a hexapod.

The facet mirror can have six degrees of freedom, namely three translational degrees of freedom along the x-direction, the y-direction and the z-direction, and three rotational degrees of freedom about the x-direction, the y-direction and the z-direction, respectively. The "position" of the facet mirror should be understood to be its coordinates or the coordinates of a measurement point provided on the facet mirror with respect to the x-direction, the y-direction and the z-direction. In the present case, the "orientation" of the facet mirror should be understood to mean its tilt in relation to the x-direction, the y-direction and the z-direction. Accordingly, the "pose" of the facet mirror should be understood to mean both its position and its orientation.

With the aid of spacers provided at the interfaces, the facet mirror is able to be adjusted in terms of each of its six degrees of freedom. For example, six interfaces are provided. Each degree of freedom is uniquely determined by all interfaces. In the present case, "adjusting" or "aligning" should be understood to mean that the facet mirror can be brought from an actual pose to a target pose. The actual pose and the target pose can be computed. In the target pose of the facet mirror, the object field in the field plane is located in its target position. The facet mirror can comprise a mirror frame on which the interfaces are provided.

The actual position of the object field in the field plane arising for the facet mirror can be calculated on the basis of the positional relationship between facets and interfaces acquired in step a). By way of example, the calculation can be implemented with the aid of a calculation unit. The actual position may also be referred to as effective field position or calculated field position. Each facet is imaged into the field plane with an individual field. A computational overlay of these individual fields yields the virtual object field arranged in the field plane. The actual position consequently is a computed virtual position of the object field which would arise for the facet mirror provided the latter were to be installed into the optical system without the aforementioned spacers. In this case, the object field would be located at the actual position and not the target position. The actual position of the object field is computed, for example, by averaging the individual fields of the facets.

Arranging the spacers between the interfaces and the support structure may comprise calculating and/or manufacturing or selecting suitable spacers. The spacers may be disc shaped. Arranging the spacers may also be referred to as "spacing". The spacers are securely connected to the respective interface. A spacer is provided at each interface.

As mentioned previously, each degree of freedom is uniquely determined by all interfaces. By way of example, should a correction formula yield that a pure translational movement along the x-direction is used to bring the facet mirror from the actual pose to its target pose, a suitable spacer is computed for each interface so that all spacers together ensure the displacement along the x-direction. Hence, all spacers together define the translational degree of freedom along the x-direction. An analogous statement also applies to all other degrees of freedom.

The spacers differ. "Differing" may mean with a different thickness or a different shape, for example wedge-shaped. For example, individually manufactured or individually selected spacers which allow the facet mirror to be positioned in such a way that the latter is located at its target pose are used for each interface, and so the object field is located at its target position in the field plane within an admissible tolerance range.

According to an embodiment, positions of contact faces provided on a mirror frame of the facet mirror are determined in step a) relative to the interfaces provided on the mirror frame.

The contact faces can be in the form of plane faces. For example, the contact faces may be provided on the inner side of the mirror frame. The contact faces can allow assembly plates for the facets to be placed on the mirror frame with accurate positioning. The interfaces can be placed on the outside of the mirror frame. To determine the positions, the coordinates of both the contact faces and the interfaces can be determined in the x-direction, the y-direction and the z-direction. However, the coordinates in the x-direction and the y-direction are also sufficient for the contact faces.

According to a further embodiment, the positions of the contact faces relative to the interfaces are determined with the aid of a tactile measurement method.

Alternatively, an optical measurement method may also be used. By way of example, the mirror frame may be measured on a measurement table during the manufacture or the final inspection thereof, with the positions of the contact faces and the interfaces being registered at the same time.

According to a further embodiment, positions of stops provided on assembly plates of the facets and corresponding to the contact faces are determined in step a) relative to a reference plate.

By way of example, the stops provided on the assembly plates may be in the form of spherical caps or partial cylinders. In the present case, the stops "corresponding" to the contact faces means that the stops of the assembly plates, in an assembled state of same, rest against the contact faces of the mirror frame such that the assembly plates can be accurately positioned on the mirror frame in the x-direction and the y-direction. The reference plate can comprise a multiplicity of reference markings. By way of example, the reference markings can be circles, points, lines, crosses or the like. For example, the positions of the stops are determined relative to the reference markings.

According to a further embodiment, positions of the facets are determined in step a) relative to the reference plate.

The facets are assembled at or on the assembly plates. The positions of the facets during an assembly of the same on the assembly plates can be determined relative to the reference plate or the reference markings. The reference plate may have a U-shaped geometry.

According to a further embodiment, the positions of the facets relative to the reference plate are determined with the aid of image processing, for example edge detection.

The facets can be curved in arcuate form and have two lateral side edges. Four corners of the respective facet are captured during the edge detection.

According to a further embodiment, the positions of the stops relative to the reference plate and/or the positions of the facets relative to the reference plate are determined with the aid of an optical measurement method.

Alternatively, a tactile measurement method may also be used. However, an optical measurement method can enable a contactless measurement.

According to a further embodiment, an image field produced by one or more cameras is evaluated within the scope of the optical measurement method.

There can be any desired number of cameras. By way of example, two cameras, which are able to produce two image fields, are provided. By way of example, the image fields can be displaced over the reference plate, the assembly plate and/or the facets along the x-direction and the y-direction.

According to a further embodiment, positions of the facets relative to the stops are determined in step a) on the basis of the positions of the stops relative to the reference plate and on the basis of the positions of the facets relative to the reference plate.

For example, this means that the relative position of a facet in relation to each stop is known for all facets. The facets can be measured in a neutral centre position.

According to a further embodiment, positions of the facets relative to the interfaces are determined in step a) on the basis of the positions of the facets relative to the stops and on the basis of the positions of the contact faces relative to the interfaces.

This can be implemented by suitably combining the obtained measurement values by calculation. As a result of the position of each facet being known in relation to each interface, it is possible to align the facet mirror in such a way that the object field comes to rest at its target position.

According to a further embodiment, the actual position of the object field is calculated in step b) on the basis of the positions of the facets relative to the interfaces.

As a result of the positions of the facets being known relative to the interfaces, it is possible to compute the actual position which an object field would have in the field plane if no spacer is yet provided at the interfaces.

According to a further embodiment, a correction formula for the spacers is calculated during or before step c), wherein the application of the correction formula leads to the object field being brought from the calculated actual position to the target position in the field plane.

For example, the object field is only brought virtually from the actual position to the target position. As a result of the application of the correction formula, according to which suitable spacers are installed, the object field is in its target position in the field plane without a further adjustment when the facet mirror is installed into the optical system.

According to a further embodiment, on the basis of the correction formula, the spacers are manufactured on an individual basis and/or selected from a multiplicity of spacers with different dimensions.

By way of example, the spacers can be disc shaped. The spacers can be polished. The spacers may also have a wedge-shaped geometry. For example, a kit can be kept available, the kit storing certain thickness increments of the spacers. By way of example, it is possible to store spacers with thickness increments of ±5 μm. The appropriate spacers are then selected and installed at the interfaces on the basis of the correction formula.

According to a further embodiment, the spacers comprise piezoceramic actuators, with the aid of which the correction formula is set.

In this case, swapping the spacers can be dispensed with. In the present case, "comprise" may mean that the spacers are formed as piezoceramic actuators.

According to a further embodiment, the facet mirror comprises six spatial degrees of freedom, with each degree of freedom being uniquely determined with the aid of the interfaces.

As mentioned previously, the facet mirror comprises three translational degrees of freedom and three rotational degrees of freedom. Each interface or each spacer influences each degree of freedom. As a result of an appropriate arrangement of the spacers at the corresponding interfaces, it is possible to position the facet mirror in all six degrees of freedom so that it is located in a target pose. The target pose is computed. The object field in the field plane is in the target position as soon as the facet mirror is in the target pose. The facet mirror is assembled by way of a parallel kinematic system, for example a hexapod. In this case, each spacer acts in all six degrees of freedom. Consequently, each interface acts on the degrees of freedom in a unique manner. The parallel kinematic system is the support structure mentioned at the outset.

According to a further embodiment, the target position is specified by a facet mirror to be swapped.

For example, a facet mirror whose facets are imaged onto the field plane is removed prior to step c), with the object field of the facet mirror being located in the target position in the field plane. By way of example, the facet mirror may also have been removed prior to step a). The object field of the facet mirror to be removed is situated in the target position. When this facet mirror is swapped, it is possible with the aid of the method to replace the facet mirror without the target position in the field plane changing significantly.

"A(n)" in the present case should not necessarily be understood to be restrictive to exactly one element. Rather, a plurality of elements, such as, for example, two, three or more, can also be provided. Any other numeral used here, too, should not be understood to the effect that there is a restriction to exactly the stated number of elements. Rather, numerical deviations upwards and downwards are possible, unless indicated to the contrary.

Further possible implementations of the disclosure also comprise not explicitly mentioned combinations of any features or embodiments that are described above or below with respect to the exemplary embodiments. In this case, a person skilled in the art will also add individual aspects as improvements or supplementations to the respective basic form of the disclosure.

Further configurations and aspects of the disclosure are the subject matter of the dependent claims and also of the exemplary embodiments of the disclosure described below. The disclosure is explained in greater detail below on the basis of preferred embodiments with reference to the appended figures.

DETAILED DESCRIPTION

Unless indicated otherwise, elements that are the same or functionally the same have been given the same reference signs in the figures. It should also be noted that the illustrations in the figures are not necessarily true to scale.

Figure 1:
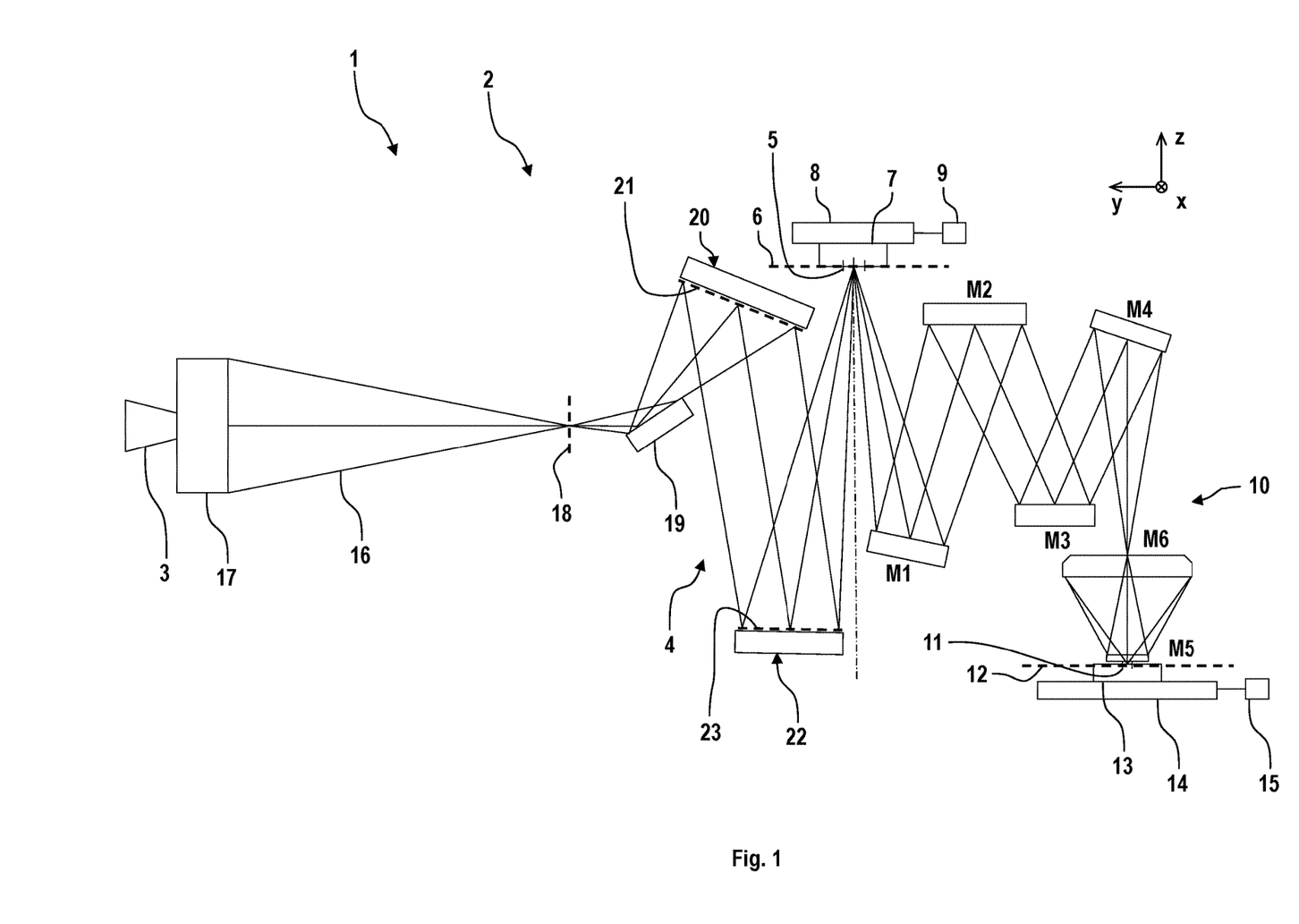
FIG. 1 shows a schematic meridional section of a projection exposure apparatus for EUV projection lithography.

FIG. 1 shows an embodiment of a projection exposure apparatus 1 (lithography apparatus), for example an EUV lithography apparatus. An embodiment of an illumination system 2 of the projection exposure apparatus 1 has, in addition to a light or radiation source 3, an illumination optical unit 4 for illuminating an object field 5 in a field plane 6. The field plane 6 may also be referred to as object plane. In an alternative embodiment, the light source 3 can also be provided as a module separate from the rest of the illumination system 2. In this case, the illumination system 2 does not comprise the light source 3.

A reticle 7 arranged in the object field 5 is exposed. The reticle 7 is held by a reticle holder 8. The reticle holder 8 is displaceable by way of a reticle displacement drive 9, for example in a scanning direction.

FIG. 1 shows, for explanatory purposes, a Cartesian coordinate system with an x-direction x, a y-direction y and a z-direction z. The x-direction x runs perpendicularly into the plane of the drawing. The y-direction y runs horizontally, and the z-direction z runs vertically. The scanning direction in FIG. 1 runs along the y-direction y. The z-direction z runs perpendicularly to the field plane 6.

The projection exposure apparatus 1 comprises a projection optical unit 10. The projection optical unit 10 serves for imaging the object field 5 into an image field 11 in an image plane 12. The image plane 12 runs parallel to the field plane 6. Alternatively, an angle that differs from 0° is also possible between the field plane 6 and the image plane 12.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15, for example along the y-direction y. The displacement, on the one hand, of the reticle 7 by way of the reticle displacement drive 9 and, on the other hand, of the wafer 13 by way of the wafer displacement drive 15 can take place in such a way as to be synchronized with each other.

The light source 3 is an EUV radiation source. The light source 3 emits, for example, EUV radiation 16, which is also referred to below as used radiation, illumination radiation or illumination light. For example, the used radiation 16 has a wavelength in the range between 5 nm and 30 nm, specifically 13.5 nm. The light source 3 can be a plasma source, for example an LPP (laser produced plasma) source or a GDPP (gas discharge produced plasma) source. It can also be a synchrotron-based radiation source. The light source 3 can be an FEL (free-electron laser).

The illumination radiation 16 emerging from the light source 3 is focused by a collector 17. The collector 17 can be a collector with one or more ellipsoidal and/or hyperboloidal reflection surfaces. The illumination radiation 16 can be incident on the at least one reflection surface of the collector 17 with grazing incidence (GI), that is to say at angles of incidence of greater than 45°, or with normal incidence (NI), that is to say at angles of incidence of less than 45°. The collector 17 can be structured and/or coated, firstly, for optimizing its reflectivity for the used radiation and, secondly, for suppressing extraneous light.

Downstream of the collector 17, the illumination radiation 16 propagates through an intermediate focus in an intermediate focal plane 18. The intermediate focal plane 18 can represent a separation between a radiation source module, having the light source 3 and the collector 17, and the illumination optical unit 4.

The illumination optical unit 4 comprises a deflection mirror 19 and, arranged downstream thereof in the beam path, a first facet mirror 20. The deflection mirror 19 can be a plane deflection mirror or, alternatively, a mirror with a beam-influencing effect that goes beyond the purely deflecting effect. Alternatively or in addition, the deflection mirror 19 can be in the form of a spectral filter which separates a used light wavelength of the illumination radiation 16 from extraneous light with a wavelength deviating therefrom. Provided the first facet mirror 20 is arranged in a plane of the illumination optical unit 4 which is optically conjugate to the field plane 6 as a field plane, this facet mirror is also referred to as a field facet mirror. The first facet mirror 20 comprises a multiplicity of individual first facets 21, which can also be referred to as field facets. Only some of these first facets 21 are shown in FIG. 1 by way of example.

The first facets 21 can be embodied as macroscopic facets, for example as rectangular facets or as facets with an arcuate edge contour or an edge contour of part of a circle. The first facets 21 may be in the form of plane facets or alternatively in the form of convexly or concavely curved facets.

As known for example from DE 10 2008 009 600 A1, the first facets 21 themselves may also be composed in each case of a multiplicity of individual mirrors, for example a multiplicity of micromirrors. The first facet mirror 20 can for example be embodied in the form of a microelectromechanical system (MEMS system). For details, reference is made to DE 10 2008 009 600 A1.

Between the collector 17 and the deflection mirror 19, the illumination radiation 16 travels horizontally, that is to say along the y-direction y.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 can also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1, and U.S. Pat. No. 6,573,978.

The second facet mirror 22 comprises a plurality of second facets 23. In the case of a pupil facet mirror, the second facets 23 are also referred to as pupil facets.

The second facets 23 can likewise be macroscopic facets, which can for example have a round, rectangular or hexagonal boundary, or can alternatively be facets composed of micromirrors. In this regard, reference is likewise made to DE 10 2008 009 600 A1.

The second facets 23 can have plane or alternatively convexly or concavely curved reflection surfaces.

The illumination optical unit 4 consequently forms a doubly faceted system. This fundamental principle is also referred to as a fly's eye condenser (fly's eye integrator).

It can be desirable to arrange the second facet mirror 22 not exactly in a plane that is optically conjugate to a pupil plane of the projection optical unit 10. For example, the second facet mirror 22 may be arranged so as to be tilted in relation to a pupil plane of the projection optical unit 10, as is described for example in DE 10 2017 220 586 A1.

With the aid of the second facet mirror 22, the individual first facets 21 are imaged into the object field 5. The second facet mirror 22 is the last beam-shaping mirror or actually the last mirror for the illumination radiation 16 in the beam path upstream of the object field 5.

In a further embodiment, not shown, of the illumination optical unit 4, a transfer optical unit contributing for example to the imaging of the first facets 21 into the object field 5 can be arranged in the beam path between the second facet mirror 22 and the object field 5. The transfer optical unit can comprise exactly one mirror or else, alternatively, two or more mirrors, which are arranged in succession in the beam path of the illumination optical unit 4. The transfer optical unit can for example comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the first facet mirror 20 and the second facet mirror 22.

In a further embodiment of the illumination optical unit 4, there is also no need for the deflection mirror 19, and so the illumination optical unit 4 can then have exactly two mirrors downstream of the collector 17, specifically the first facet mirror 20 and the second facet mirror 22.

The imaging of the first facets 21 into the field plane 6 via the second facets 23 or using the second facets 23 and a transfer optical unit is often only approximate imaging.

The projection optical unit 10 comprises a plurality of mirrors Mi, which are consecutively numbered in accordance with their arrangement in the beam path of the projection exposure apparatus 1.

In the example shown in FIG. 1, the projection optical unit 10 comprises six mirrors M1 to M6. Alternatives with four, eight, ten, twelve or any other number of mirrors Mi are similarly possible. The projection optical unit 10 is a twice-obscured optical unit. The penultimate mirror M5 and the last mirror M6 each have a through opening for the illumination radiation 16. The projection optical unit 10 has an image-side numerical aperture that is greater than 0.5 and may also be greater than 0.6, and may be for example 0.7 or 0.75.

Reflection surfaces of the mirrors Mi can be embodied as free-form surfaces without an axis of rotational symmetry. Alternatively, the reflection surfaces of the mirrors Mi can be designed as aspheric surfaces with exactly one axis of rotational symmetry of the reflection surface shape. Just like the mirrors of the illumination optical unit 4, the mirrors Mi can have highly reflective coatings for the illumination radiation 16. These coatings can be designed as multilayer coatings, for example with alternating layers of molybdenum and silicon.

The projection optical unit 10 has a large object-image offset in the y-direction y between a y-coordinate of a centre of the object field 5 and a y-coordinate of the centre of the image field 11. In the y-direction y, this object-image offset can be of approximately the same magnitude as a z-distance between the field plane 6 and the image plane 12.

For example, the projection optical unit 10 can have an anamorphic form. For example, it has different imaging scales $\beta x$, $\beta y$ in the x- and y-directions x, y. The two imaging scales $\beta x$, $\beta y$ of the projection optical unit 10 can be ($\beta x$, $\beta y$)=(+/−0.25, +/−0.125). A positive imaging scale $\beta$ means imaging without image inversion. A negative sign for the imaging scale $\beta$ means imaging with image inversion.

The projection optical unit 10 consequently leads to a reduction in size with a ratio of 4:1 in the x-direction x, that is to say in a direction perpendicular to the scanning direction.

The projection optical unit 10 leads to a reduction in size of 8:1 in the y-direction y, that is to say in the scanning direction.

Other imaging scales are likewise possible. Imaging scales with the same sign and the same absolute value in the x-direction x and y-direction y are also possible, for example with absolute values of 0.125 or of 0.25.

The number of intermediate image planes in the x-direction x and in the y-direction y in the beam path between the object field 5 and the image field 11 can be the same or can differ, depending on the embodiment of the projection optical unit 10. Examples of projection optical units with different numbers of such intermediate images in the x- and y-directions x, y are known from US 2018/0074303 A1.

In each case one of the second facets 23 is assigned to exactly one of the first facets 21 for respectively forming an illumination channel for illuminating the object field 5. This may for example produce illumination according to the Köhler principle. The far field is decomposed into a multiplicity of object fields 5 with the aid of the first facets 21. The first facets 21 produce a plurality of images of the intermediate focus on the second facets 23 respectively assigned to them.

By way of an assigned second facet 23, the first facets 21 are in each case imaged onto the reticle 7 in a manner overlaid on one another for the purposes of illuminating the object field 5. The illumination of the object field 5 is for example as homogeneous as possible. It can have a uniformity error of less than 2%. The field uniformity can be achieved by way of the overlay of different illumination channels.

The full-area illumination of the entrance pupil of the projection optical unit 10 can be defined geometrically by an arrangement of the second facets 23. The intensity distribution in the entrance pupil of the projection optical unit 10 can be set by selecting the illumination channels, for example the subset of the second facets 23, which guide light. This intensity distribution is also referred to as illumination setting or illumination pupil filling.

A likewise desired pupil uniformity in the region of portions of an illumination pupil of the illumination optical unit 4 which are illuminated in a defined manner can be achieved by a redistribution of the illumination channels.

Further aspects and details of the illumination of the object field 5 and for example of the entrance pupil of the projection optical unit 10 are described below.

For example, the projection optical unit 10 can have a homocentric entrance pupil. The latter can be accessible. It can also be inaccessible.

The entrance pupil of the projection optical unit 10 frequently cannot be exactly illuminated with the second facet mirror 22. When imaging the projection optical unit 10, which images the centre of the second facet mirror 22 telecentrically onto the wafer 13, the aperture rays often do not intersect at a single point. However, it is possible to find an area in which the distance of the aperture rays determined in pairs becomes minimal. This area represents the entrance pupil or an area in real space that is conjugate thereto. For example, this area has a finite curvature.

It may be the case that the projection optical unit 10 has different poses of the entrance pupil for the tangential beam path and for the sagittal beam path. In this case, an imaging element, for example an optical component element of the transfer optical unit, should be provided between the second facet mirror 22 and the reticle 7. With the aid of this optical element, the different poses of the tangential entrance pupil and the sagittal entrance pupil can be taken into account.

In the arrangement of the components of the illumination optical unit 4 shown in FIG. 1, the second facet mirror 22 is arranged in an area conjugate to the entrance pupil of the projection optical unit 10. The first facet mirror 20 is arranged so as to be tilted with respect to the field plane 6. The first facet mirror 20 is arranged so as to be tilted with respect to an arrangement plane defined by the deflection mirror 19. The first facet mirror 20 is arranged so as to be tilted with respect to an arrangement plane defined by the second facet mirror 22.

Figure 2:
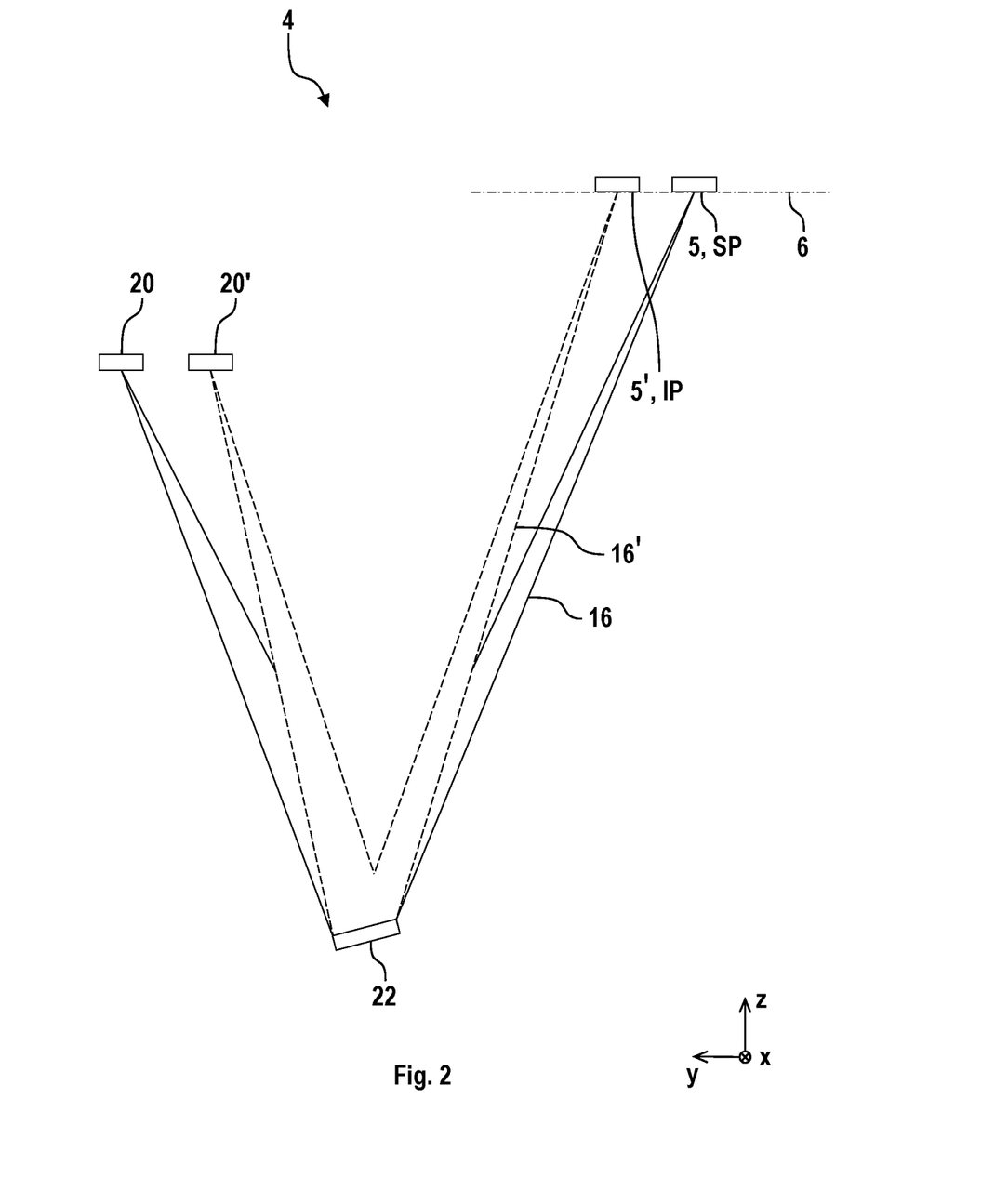
FIG. 2 shows a schematic view of an embodiment of an illumination optical unit for the projection exposure apparatus in accordance with FIG. 1.

FIG. 2 shows a much-simplified schematic view of an embodiment of an illumination optical unit 4 as mentioned previously. The illumination optical unit 4 is an optical system and may therefore also be referred to as such. As mentioned previously, the illumination optical unit comprises a first facet mirror 20 or field facet mirror, which may also be referred to as such, and a second facet mirror 22 or pupil facet mirror, which may also be referred to as such.

During the operation of the projection exposure apparatus 1, the first facets 21 (see FIG. 1) or field facets of the facet mirror 20 are imaged into an object field 5 in the field plane 6 with the aid of the pupil facet mirror 22. Each facet 21 is assigned an individual field. In the present case, an "individual field" should be understood to mean the image representation of the respective facet 21 in the field plane 6. The superposition of all individual fields of all facets 21 in the field plane 6 yields the object field 5. The object field 5 has a target position SP in the field plane 6. In the present case, the "target position SP" should be understood to mean the coordinates of the object field 5 in the image plane 6 in relation to the x-direction x and the y-direction y.

It may be desirable to swap the facet mirror 20 after the projection exposure apparatus 1 has been in operation for a certain amount of time. By way of example, a tin contamination originating from the light source 3 may make it desirable to swap the facet mirror 20.

As shown in FIG. 2, the facet mirror 20 can be swapped for a new or different first facet mirror 20' or field facet mirror. This "mirror swap" or "swap" may lead to the facets 21 of the facet mirror 20' being offset in relation to the swapped facet mirror 20. This may have as a consequence an unwanted displacement of the illumination radiation 16' and object field 5' in the field plane 6. In that case, the object field 5' has an actual position IP. In the present case, the "actual position I" should be understood to mean the coordinates of the object field 5' in the field plane 6 in relation to the x-direction x and the y-direction y.

This displacement of the object field 5, 5' may be referred to as displacement of the field pose. Avoiding this problem by way of extremely tight mechanical manufacturing and construction tolerances with an acceptable effect on the field pose is not possible from a technical or economic point of view. This needs to be improved.

Figure 3:
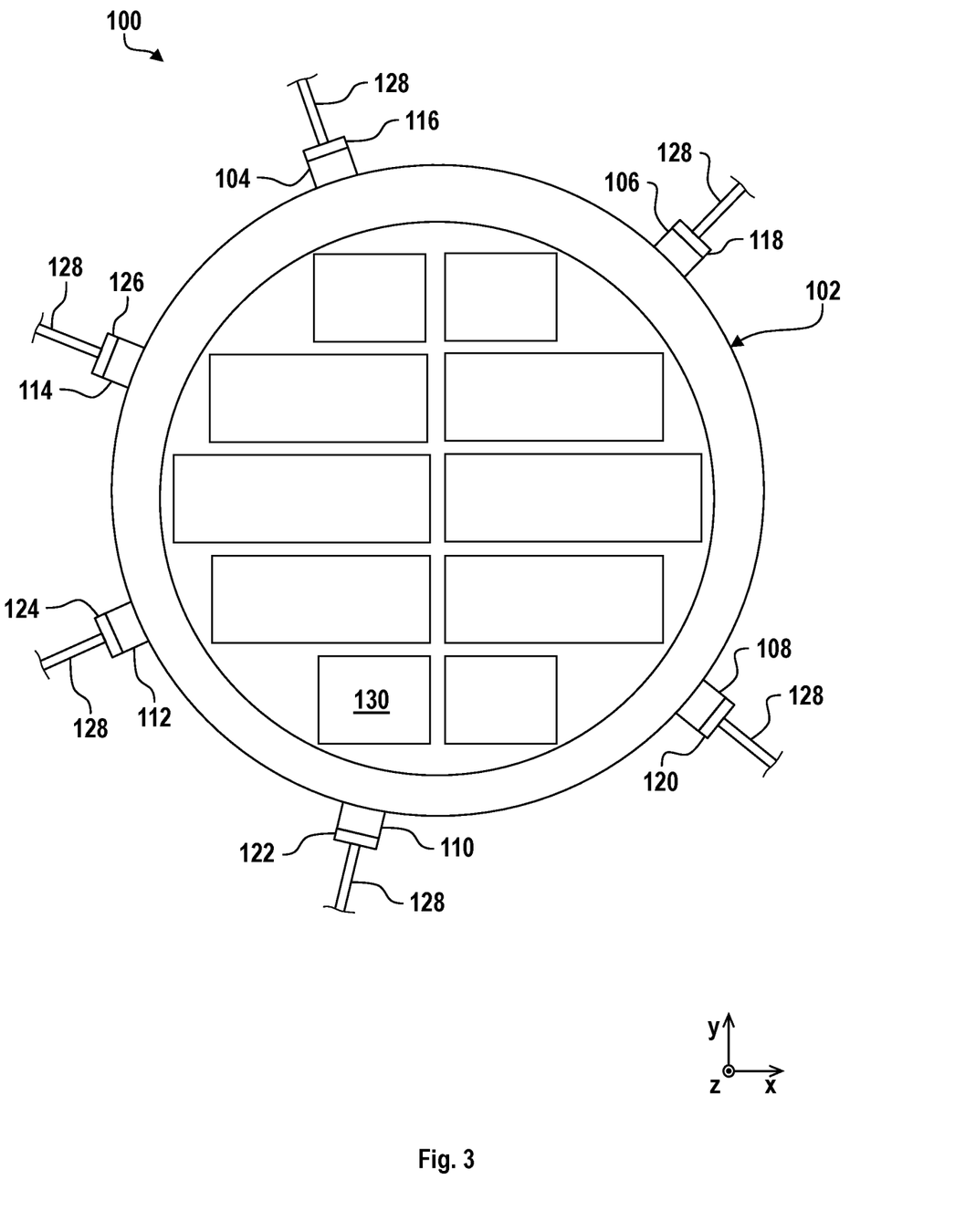
FIG. 3 shows a schematic plan view of an embodiment of a facet mirror for the illumination optical unit in accordance with FIG. 2.

FIG. 3 shows a schematic plan view of an embodiment of a facet mirror 100. The facet mirror 100 is a field facet mirror and may also be referred to as such. By way of example, the facet mirror 100 may be the aforementioned facet mirror 20', which is swapped with the facet mirror 20. The facet mirror 100 comprises a mirror frame 102. The facet mirror 100 or the mirror frame 102 is assigned a coordinate system comprising the x-direction x, the y-direction y and the z-direction z.

The facet mirror 100 has six degrees of freedom, namely three translational degrees of freedom along the x-direction x, the y-direction y and the z-direction z, respectively, and three rotational degrees of freedom about the x-direction x, the y-direction y and the z-direction z, respectively. In other words, a position and an orientation of the facet mirror 100 can be determined or described with the aid of the six degrees of freedom. The "position" of the facet mirror 100 should be understood to be, for example, its coordinates or the coordinates of a measurement point provided on the facet mirror 100 with respect to the x-direction x, the y-direction y and the z-direction z.

The "orientation" of the facet mirror 100 should be understood to be, for example, its tilt with respect to the three spatial directions x, y, z. In other words, the facet mirror 100 can be tilted about the x-direction x, the y-direction y and/or the z-direction z. This gives the six degrees of freedom for the position and/or orientation of the facet mirror 100. A "pose" of the facet mirror 100 comprises both its position and its orientation.

The six degrees of freedom are assigned interfaces 104, 106, 108, 110, 112, 114. Each interface 104, 106, 108, 110, 112, 114 influences each degree of freedom. The pose of the facet mirror 100 can be adjusted or aligned with the aid of a plurality of spacers 116, 118, 120, 122, 124, 126, with each interface 104, 106, 108, 110, 112, 114 being assigned such a spacer 116, 118, 120, 122, 124, 126. The interfaces 104, 106, 108, 110, 112, 114 and spacers 116, 118, 120, 122, 124, 126 shown in FIG. 3 should only be understood as symbolic. In fact, unlike what is shown in FIG. 3, the interfaces 104, 106, 108, 110, 112, 114 and the spacers 116, 118, 120, 122, 124, 126 are not arranged in a common plane which is spanned by the x-direction x and the y-direction y.

In the present case, "adjusting" or "aligning" can be understood to mean bringing the facet mirror 100 from an actual position to a target position. The spacers 116, 118, 120, 122, 124, 126 may be polished individually or taken from a kit with appropriately graduated thicknesses. A support structure 128, for example what is known as a hexapod, is assembled on the interfaces 104, 106, 108, 110, 112, 114. In this case, the spacers 116, 118, 120, 122, 124, 126 are arranged between the interfaces 104, 106, 108, 110, 112, 114 and the support structure 128. Like the interfaces 104, 106, 108, 110, 112, 114 and the spacers 116, 118, 120, 122, 124, 126, the support structure 128 is only depicted symbolically in FIG. 3. The spacers 116, 118, 120, 122, 124, 126 are securely connected to the interfaces 104, 106, 108, 110, 112, 114.

In order to be able to solve the aforementioned problem of the displacement of the field pose when the facet mirror 100 is swapped, the positions of the interfaces 104, 106, 108, 110, 112, 114 are initially registered. This can be implemented with the aid of a tactile or optical measurement method. Once the interfaces 104, 106, 108, 110, 112, 114 have been detected, the positions thereof in the coordinate system spanned by the x-direction x, the y-direction y and the z-direction z are known. Further, the positions of the interfaces 104, 106, 108, 110, 112, 114 relative to one another are also known.

The facet mirror 100 comprises a multiplicity of facets as explained above (but not shown here). By way of example, approximately 300 facets are provided. The facets are combined in blocks group-by-group. Each of these blocks comprises an assembly plate 130, only one of which is provided with a reference sign in FIG. 3. By way of example, ten assembly plates 130, which may have different sizes, are provided. The facets (not shown) are assembled on the assembly plates 130. Reference is made below to just one assembly plate 130.

Figure 4:
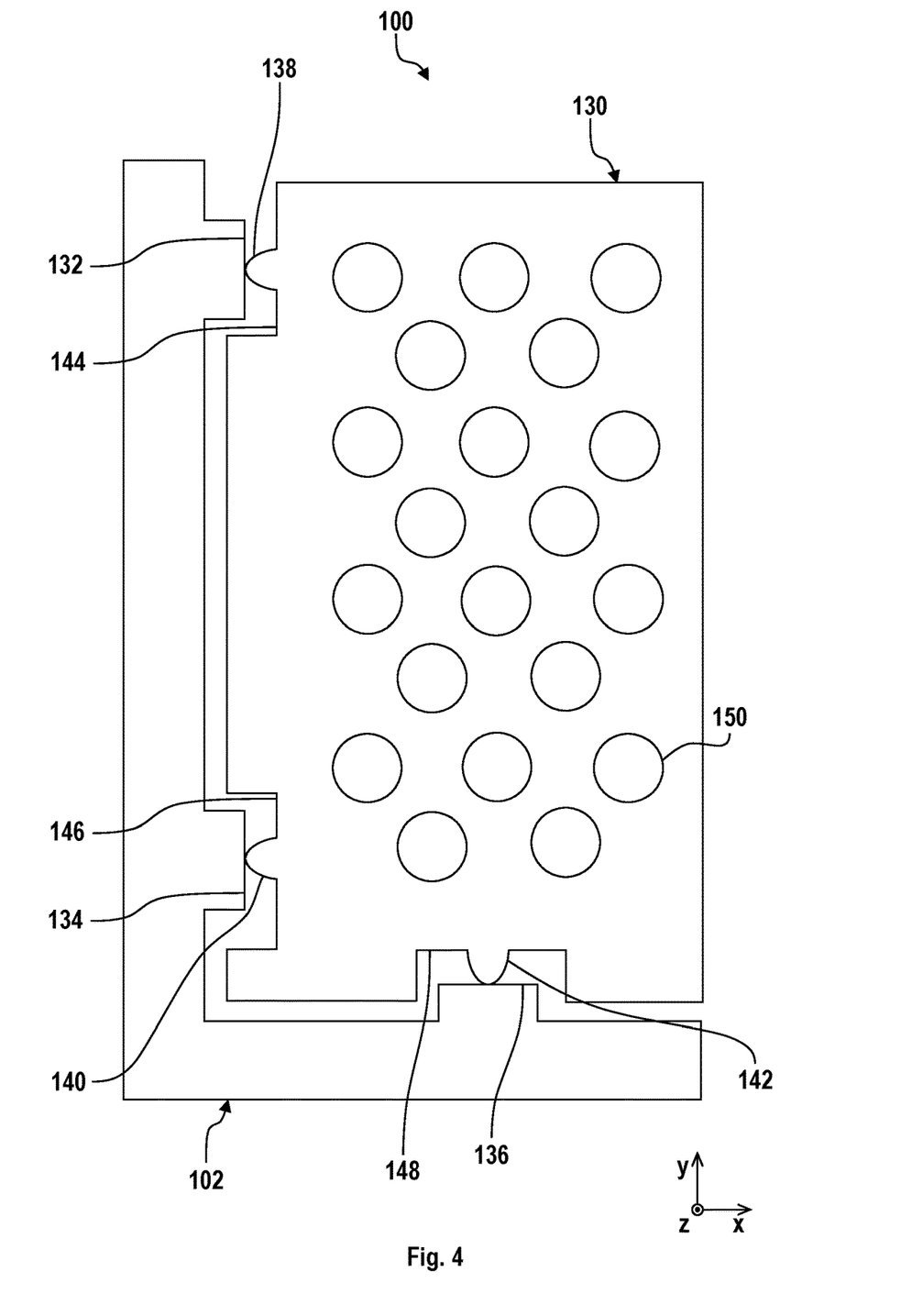
FIG. 4 shows a schematic detailed view of the facet mirror in accordance with FIG. 3.

FIG. 4 shows a detailed view of the assembly plate 130 together with a part of the mirror frame 102. The mirror frame 102, only sections of which are shown in FIG. 4, comprises a plurality of contact faces, for example three contact faces 132, 134, 136, per assembly plate 130. By way of example, a first contact face 132, a second contact face 134 and a third contact face 136 are provided. The contact faces 132, 134, 136 are configured as plane faces which project inwardly from the mirror frame 102 in the direction of the assembly plate 130. The contact faces 132, 134 are each located in a plane spanned by the y-direction y and z-direction z. The contact face 136 is located in a plane spanned by the x-direction x and z-direction z.

The assembly plate 130 comprises stops 138, 140, 142 that correspond to the contact faces 132, 134, 136. The stops 138, 140, 142 may have a spherical or half-cylindrical form. The stops 138, 140, 142 are received in cutouts 144, 146, 148 provided in the assembly plate 130 such that these stops do not protrude laterally beyond a respective edge of the assembly plate 130. With the aid of the contact faces 132, 134, 136 and the stops 138, 140, 142 of the assembly plate 130 in contact therewith, it is possible to place the assembly plate 130 on or in the mirror frame 102 with accurate positioning in relation to the x-direction x and the y-direction y.

The assembly plate 130 comprises a multiplicity of drilled holes or perforations 150 for the assembly, only one of which has been provided with a reference sign in FIG. 4. The facets (not shown) are assembled on or in the assembly perforations 150. The assembly perforations 150 are arranged with a uniform distribution over the assembly plate 130, in pattern-like or grid-shaped fashion.

The coordinates of the contact faces 132, 134, 136 are registered in the x-direction x and the y-direction y before or after the detection of the interfaces 104, 106, 108, 110, 112, 114. Hence, the position of each contact face 132, 134, 136, the spatial relationship of the contact faces 132, 134, 136 among themselves and the positions thereof relative to the interfaces 104, 106, 108, 110, 112, 114 are known. The contact faces 132, 134, 136 can be detected in tactile or optical fashion.

Figure 5:
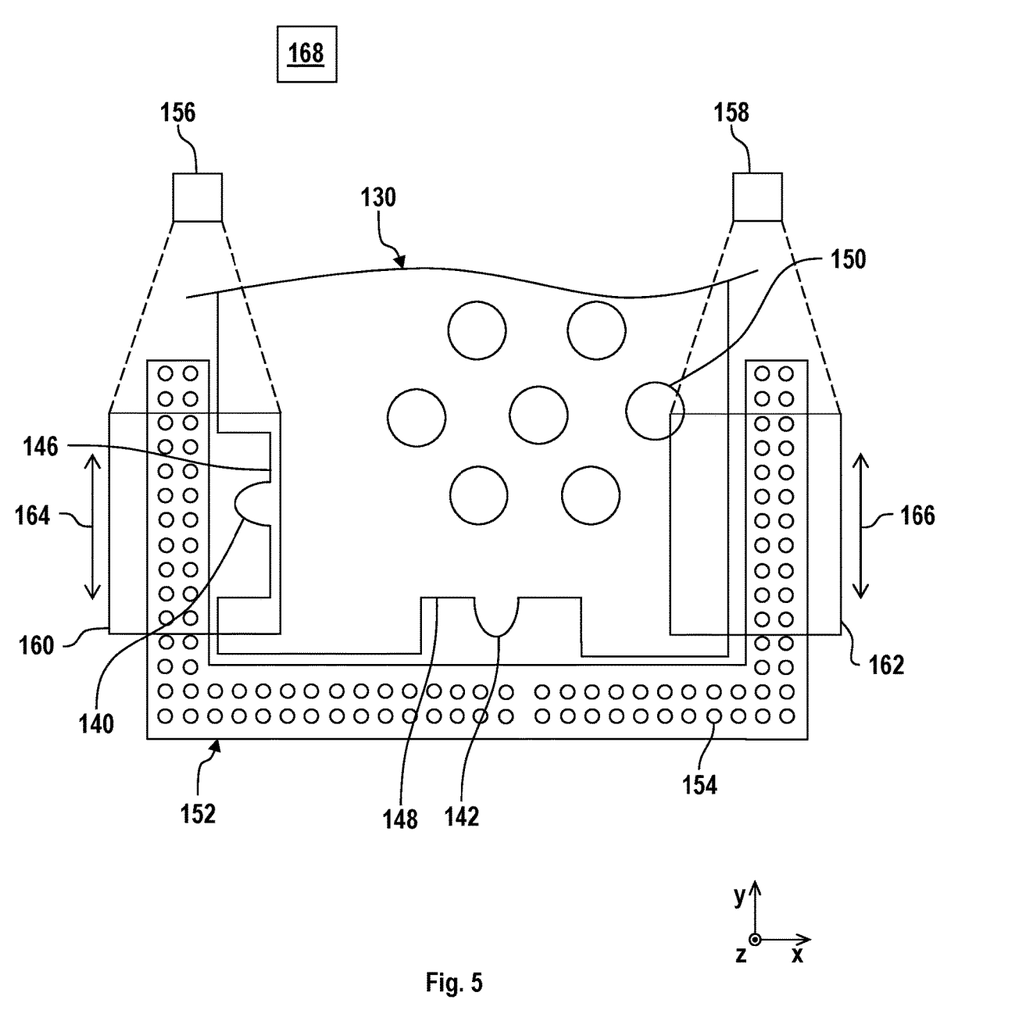
FIG. 5 shows a measurement of an assembly plate of the facet mirror in accordance with FIG. 3.

FIG. 5 shows the assembly plate 130 being measured. To this end, use is made of a reference plate 152, into which the assembly plate 130 is inserted or which is placed around the assembly plate 130. The reference plate 152 may also be referred to as reference structure. The reference plate 152 comprises a multiplicity of reference markings 154, only one of which has been provided with a reference sign in FIG. 5. The reference markings 154 can be circles, as shown in FIG. 5. The reference markings 154 may however also be punctiform, linear or cruciform. The reference markings 154 are arranged like a grid or in the form of a pattern. The reference plate 152 itself may be U-shaped.

Image fields 160, 162 which are freely positionable along the x-direction x and the y-direction y, as is indicated in FIG. 5 with the aid of arrows 164, 166, are provided with the aid of one or more cameras 156, 158. The reference plate 152 and the stops 138, 140, 142 of the assembly plate 130 may be detected with the aid of the image fields 160, 162. By evaluating the image fields 160, 162, it is possible to obtain the position, for example the coordinates in the x-direction x and the y-direction y, of the stops 138, 140, 142 relative to the reference plate 152 or to the reference markings 154, and also of the stops 138, 140, 142 in relation to one another. A computing unit 168 may be provided for the evaluation of the image fields 160, 162.

Figure 6:
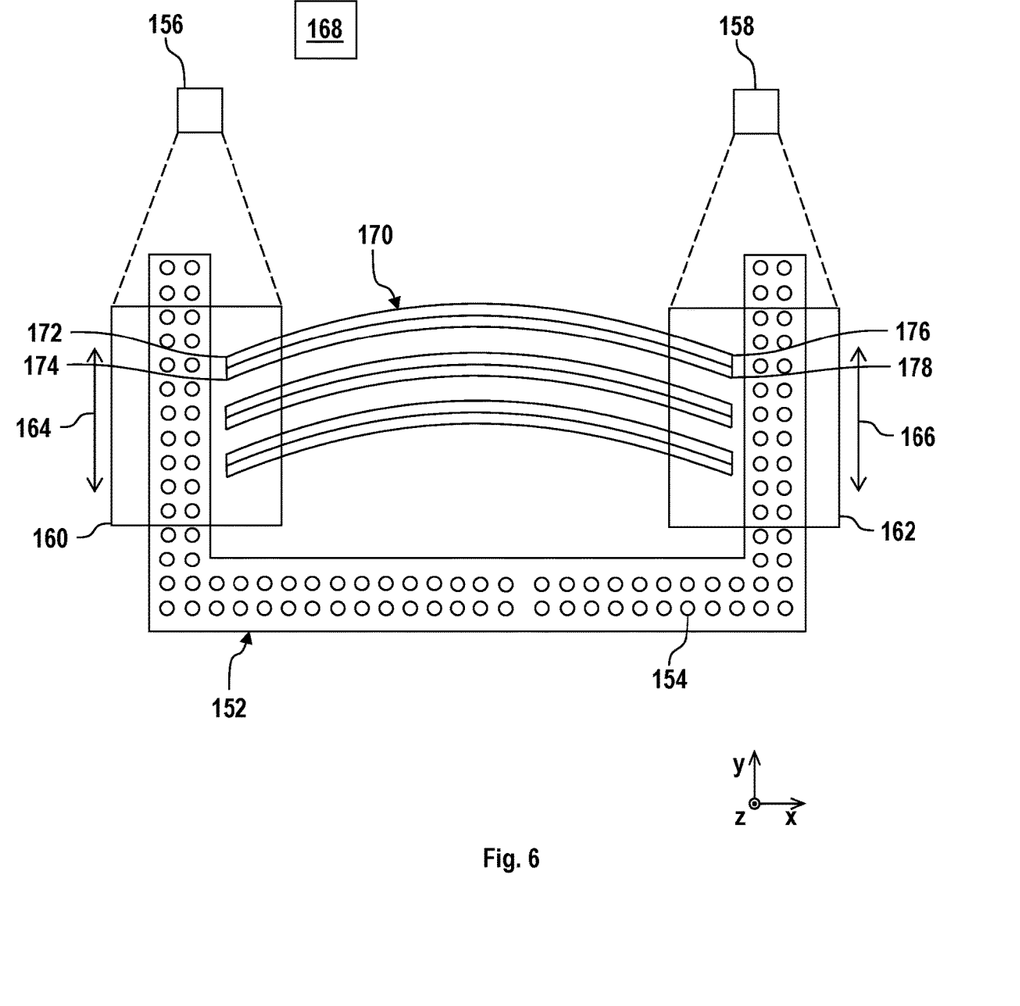
FIG. 6 shows a measurement of facets of the facet mirror in accordance with FIG. 3.

FIG. 6 shows the position of facets 170, only one of which has been provided with a reference sign in FIG. 6, assembled on the assembly plate 130 (not shown in FIG. 6) being measured. The facets 170 can be measured while the assembly plate 130 is being equipped with the facets 170.

To this end, the respective position of the facet 170 in relation to the reference plate 152 or in relation to the reference markings 154 is determined from the image fields 160, 162. For example, the position of the facets 170 can be determined by detecting edges, for example side edges, of the facets 170. However, other methods are also possible. By way of example, there could be a cross-correlation of camera images of the facets 170. When the edges of the facets 170 are measured, four corners 172, 174, 176, 178 of each facet 170 are detected. Consequently, the coordinates of the corners 172, 174, 176, 178 in relation to the reference plate 152 or the reference markings 154 are known in the x-direction x and the y-direction y. To this end, the image fields 160, 162 are displaced in and counter to the y-direction y.

Consequently, the positions of all facets 170 are known relative to the reference plate 152 or relative to the reference markings 154. Further, the positions of the stops 138, 140, 142 of the assembly plate 130 are also known relative to the reference plate 152. By way of an appropriate combination of the coordinates by calculation, for example with the aid of the computing unit 168, it is possible to determine the positions of all facets 170 relative to the stops 138, 140, 142 of the assembly plate 130.

As mentioned previously, the positions of the contact faces 132, 134, 136 are known relative to the interfaces 104, 106, 108, 110, 112, 114. In this case, it is irrelevant whether the mirror frame 102 or the assembly plate 130 is measured first. The position of all facets 170 relative to the interfaces 104, 106, 108, 110, 112, 114 can be determined by a geometrically correct combination of all measurement values obtained.

Each facet 170 has translation errors on account of installation and manufacturing tolerances. In the present case, a "translation error" should be understood to mean an offset in the x-direction x, y-direction y and/or the z-direction z. Further, each facet 170 is independently tiltable. However, a tilt angle of the facets 170 is irrelevant to the aforementioned measurement. As measured previously, each facet 170 is imaged into the field plane 6 as an individual field as a matter of principle. These individual fields are overlaid by calculation and virtually imaged into the field plane 6 as a mean value. This mean value yields the object field 5', which is located at the actual position IP in the field plane 6. Consequently, the actual position IP is computed.

Consequently, the mean actual position IP of the object field 5' can be computed from the acquired measurement values as a superposition of the individual fields of the facets 170 in the field plane 6, which mean actual position would initially arise for the facet mirror 100 without spacing the interfaces 104, 106, 108, 110, 112, 114. The calculation is implemented with the aid of averaging the individual fields of the facets 170. However, as explained above, this computed object field 5' in accordance with the actual position IP deviates from the object field 5 of the facet mirror 20 to be swapped. That is to say, the computed actual position IP of the object field 5' of the facet mirror 100 does not correspond to the target position SP.

The target position SP may also correspond to the actual position IP of the facet mirror 20 to be swapped. That is to say the facet mirror 20 may specify the target position SP. As a result, corrections which were carried out when swapping the facet mirror 20 with the facet mirror 100 in the illumination optical unit 4 and for the purposes of compensating errors of the facet mirror 20 may be adopted for the facet mirror 100.

Subsequently, spacers 116, 118, 120, 122, 124, 126 fitting to the interfaces 104, 106, 108, 110, 112, 114 are computed and manufactured. The interfaces 104, 106, 108, 110, 112, 114 are subsequently spaced in such a way that the field pose, that is to say the object field 5 of the swapped facet mirror 20, is maintained within the scope of acceptable limits, for instance of the order of 50 μm, of the facet mirror 100.

Expressed differently, the spacers 116, 118, 120, 122, 124, 126 are calculated and inserted at the interfaces 104, 106, 108, 110, 112, 114 so that the actual position IP in the object field 5' of the facet mirror 100 is brought to the target position SP of the object field 5. The remaining change in the field pose connected therewith during the swap of the facet mirror 100 is acceptable for the functionality of the projection exposure apparatus 1.

The spacers 116, 118, 120, 122, 124, 126 may also be or comprise piezoceramic actuators, with the aid of which the correction formula is able to be set. In this case, an individual manufacture or a selection of suitable spacers 116, 118, 120, 122, 124, 126 is able to be dispensed with.

When spacing the interfaces 104, 106, 108, 110, 112, 114, a mean value of all individual fields of the facets 170 is set to its nominal design value. The nominal design value corresponds to the target position SP. The nominal value or the nominal design value is the value without tolerances. When swapping the facet mirror 20, this ensures that the field pose remains within the scope of acceptable boundaries. As mentioned previously, the target position SP may be specified by the facet mirror 20 to be swapped.

With the aid of the above-described procedure, it is possible to maintain the field pose without an additional adjustment in the case of a mirror swap. No additional field pose test stands are used. The measurement of the positions of the facets 170 on the assembly plate 130 can be integrated into assembly stands used in any case. However, a seamless measurement chain of positions of the facets 170 relative to the interfaces 104, 106, 108, 110, 112, 114 is used.

Figure 7:
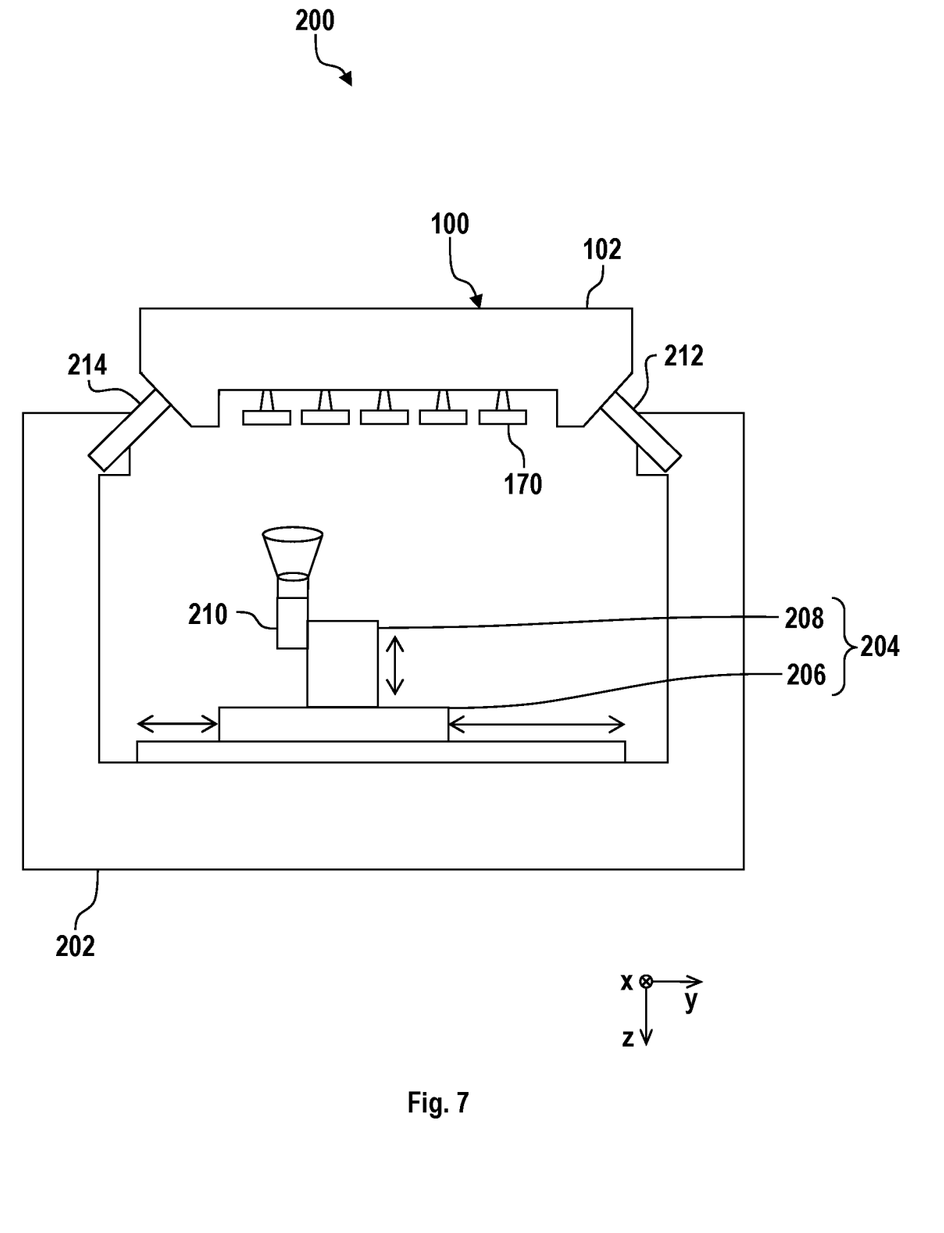
FIG. 7 shows a schematic view of an embodiment of a test stand for measuring the facet mirror in accordance with FIG. 3.

FIG. 7 shows an embodiment of a test stand 200 for measuring the facet mirror 100. The test stand 200 is suitable for measuring the entire facet mirror 100 with the facets 170. The test stand 200 comprises a measurement table 202, which may have a U-shaped embodiment.

The measurement table 202 carries a positioning device 204 comprising a first displacement unit 206, which enables a displacement along the x-direction x and the y-direction y, and a second displacement unit 208, which enables a displacement along the z-direction z. The second displacement unit 208 carries a camera 210. Hexapod interfaces 212, 214 for connecting the interfaces 104, 106, 108, 110, 112, 114 are provided on the measurement table 202.

With the aid of the test stand 200, it is possible to capture the positions of the facets 170 in the fully constructed facet mirror 100 by way of image processing, for example edge detection. As mentioned previously, it is then also possible in this case to compute and manufacture fitting spacers 116, 118, 120, 122, 124, 126 for the interfaces 104, 106, 108, 110, 112, 114. However, a dedicated test stand 200 with configuration and calibration methods is used in that case.

Figure 8:
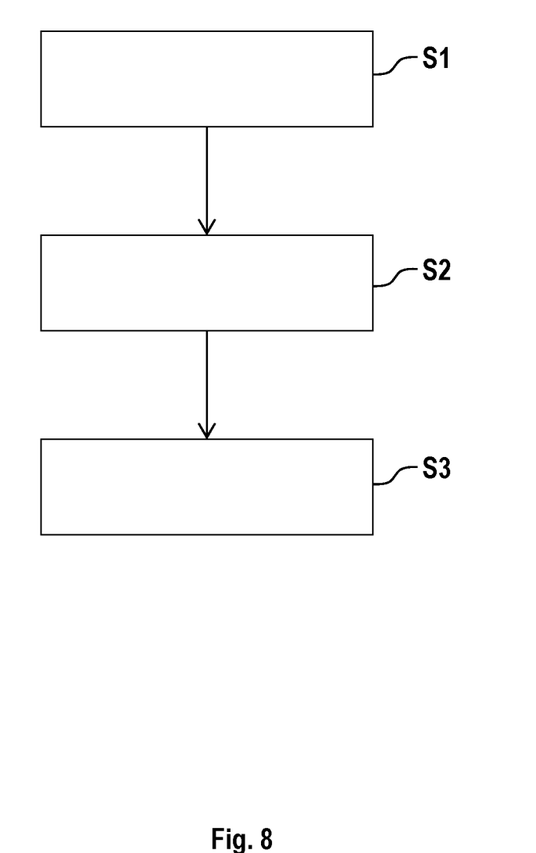
FIG. 8 shows a schematic block diagram of an embodiment of a method of assembling the facet mirror in accordance with FIG. 3.

FIG. 8 shows a schematic block diagram of an embodiment of a method of assembling or swapping the facet mirror 100. In the method, positions of the facets 170 of the facet mirror 100 are determined in a step S1 relative to the interfaces 104, 106, 108, 110, 112, 114 of the facet mirror 100, with the aid of which the facet mirror 100 is able to be connected to the support structure 128. As mentioned previously, this step S1 is implemented in many stages in a plurality of individual measurement steps.

In a step S2, the actual position IP of the object field 5' of the optical system or illumination optical unit 4 arising for the facet mirror 100 in the field plane 6 is computed. This position may also be referred to as effective field pose. In a step S3, the spacers 116, 118, 120, 122, 124, 126 are arranged between the interfaces 104, 106, 108, 110, 112, 114 and the support structure 128 so that the object field 5' in the field plane 6 is brought from the calculated actual position IP to the target position SP.

The positions of contact faces 132, 134, 136 provided on the mirror frame 102 of the facet mirror 100 are determined in step S1 relative to the interfaces 104, 106, 108, 110, 112, 114 provided on the mirror frame 102. This can be implemented with the aid of a tactile measurement method. However, an optical measurement method may also be used. Further, positions of stops 138, 140, 142 provided on the assembly plates 130 of the facets 170 and corresponding to the contact faces 132, 134, 136 are determined in step S1 relative to the reference plate 152. This can also be implemented in tactile fashion. In this case, "corresponding" means that the stops 138, 140, 142 rest against the contact faces 132, 134, 136 in order to be able to place the assembly plate 130 with accurate positioning.

Positions of the facets 170 relative to the reference plate 152 are also determined in step S1. This can be implemented optically with the aid of edge detection. In principle, an optical measurement method can be used for determining the positions of the stops 138, 140, 142 relative to the reference plate 152 and/or determining the positions of the facets 170 relative to the reference plate 152. In this context, an image field 160, 162 produced by a camera 156, 158 is evaluated.

Furthermore, positions of the facets 170 relative to the stops 138, 140, 142 are determined or computed in step S1 on the basis of the positions of the stops 138, 140, 142 relative to the reference plate 152 and on the basis of the positions of the facets 170 relative to the reference plate 152. The positions of the facets 170 relative to the interfaces 104, 106, 108, 110, 112, 114 can be determined on the basis of the positions of the facets 170 relative to the stops 138, 140, 142 and on the basis of the positions of the contact faces 132, 134, 136 relative to the interfaces 104, 106, 108, 110, 112, 114.

The actual position IP of the object field 5' is calculated in step S2, optionally on the basis of the positions of the facets 170 relative to the interfaces 104, 106, 108, 110, 112, 114. This is implemented by averaging. As mentioned previously, the actual position IP of the object field 5' is computed by averaging the individual fields of the facets 170 in the field plane 6.

A correction formula for the spacers 116, 118, 120, 122, 124, 126 is calculated during or before step S3, wherein the application of the correction formula leads to the object field 5' being brought from the calculated actual position IP to the target position SP in the field plane 6. The spacers 116, 118, 120, 122, 124, 126 can be manufactured individually on the basis of the correction formula. Alternatively or in addition, it can be selected from a multiplicity of spacers 116, 118, 120, 122, 124, 126 with different dimensions. Consequently, it is possible to provide a kit of different spacers 116, 118, 120, 122, 124, 126.

Although the present disclosure has been described with reference to exemplary embodiments, it is modifiable in various ways.

LIST OF REFERENCE SIGNS

1 Projection exposure apparatus
2 Illumination system
3 Light source
4 Illumination optical unit/optical system
5 Object field
5' Object field
6 Field plane
7 Reticle
8 Reticle holder
9 Reticle displacement drive
10 Projection optical unit
11 Image field
12 Image plane
13 Wafer
14 Wafer holder
15 Wafer displacement drive
16 Illumination radiation
16' Illumination radiation
17 Collector
18 Intermediate focal plane 19 Deflection mirror
20 First facet mirror
20' First facet mirror
21 First facet
22 Second facet mirror
23 Second facet
100 Facet mirror
102 Mirror frame
104 Interface
106 Interface
108 Interface
110 Interface
112 Interface
114 Interface
116 Spacer
118 Spacer
120 Spacer
122 Spacer
124 Spacer
126 Spacer
128 Support structure
130 Assembly plate
132 Contact face
134 Contact face
136 Contact face
138 Stop
140 Stop
142 Stop
144 Cutout
146 Cutout
148 Cutout
150 Assembly perforation
152 Reference plate
154 Reference marking
156 Camera
158 Camera
160 Image field
162 Image field
164 Arrow
166 Arrow
168 Computing unit
170 Facet
172 Corner
174 Corner
176 Corner
178 Corner
200 Test stand
202 Measurement table
204 Positioning device
206 Displacement unit
208 Displacement unit
210 Camera
212 Hexapod interface
214 Hexapod interface
IP Actual position
M1 Mirror
M2 Mirror
M3 Mirror
M4 Mirror
M5 Mirror
M6 Mirror
SP Target position
S1 Step
S2 Step
S3 Step
x x-direction
y y-direction
z z-direction

What is claimed is:

1. A method of assembling a facet mirror of an optical system configured so that facets of the facet mirror are imageable onto a field plane of the optical system, the method comprising:
   a) determining positions of the facets of the facet mirror relative to interfaces of the facet mirror so that the facet mirror is connectable to a support structure;
   b) calculating an actual position of an object field of the optical system arising for the facet mirror in the field plane; and
   c) arranging spacers between the interfaces and the support structure so that the object field in the field plane is brought from the calculated actual position to a target position,
   wherein a) comprises determining positions of contact faces provided on a mirror frame of the facet mirror relative to the interfaces provided on the mirror frame, and
   wherein a) comprises determining positions of stops provided on assembly plates of the facets and corresponding to the contact faces relative to a reference plate.

2. The method of claim 1 wherein determining the positions of the contact faces relative to the interfaces comprises using a tactile measurement method.

3. The method of claim 1, wherein a) comprises determining positions of the facets relative to the reference plate.

4. The method of claim 3, wherein determining the positions of the facets relative to the reference plate comprises using image processing.

5. The method of claim 3, wherein determining the positions of the facets relative to the reference plate comprises using edge detection.

6. The method of claim 3, wherein a) comprises determining positions of the facets relative to the stops based on the positions of the stops relative to the reference plate and based on the positions of the facets relative to the reference plate.

7. The method of claim 6, wherein a) comprises determining positions of the facets relative to the interfaces based on the positions of the facets relative to the stops and based on the positions of the contact faces relative to the interfaces.

8. The method of claim 7, wherein b) comprises calculating the actual position of the object field based on the positions of the facets relative to the interfaces.

9. The method of claim 1, wherein determining the positions of the stops relative to the reference plate and/or the positions of the facets relative to the reference plate comprises using an optical measurement method.

10. The method of claim 9, wherein the optical measurement method comprises evaluating an image field produced by one or more cameras.

11. The method of claim 1, further comprising, during or before c), calculating a correction formula for the spacers, wherein applying the correction formula causes the object field to be brought from the calculated actual position to the target position in the field plane.

12. The method of claim 11, further comprising, based on the basis of the correction formula, manufacturing the spacers on an individual basis and/or selecting the spacers from a multiplicity of spacers with different dimensions.

13. The method of claim 11, wherein the spacers comprise piezoceramic actuators.

14. The method of claim 13, further comprising using the piezoceramic actuators to set the correction formula.

15. The method of claim 11, wherein a) comprises determining positions of contact faces provided on a mirror frame of the facet mirror relative to the interfaces provided on the mirror frame.

16. The method of claim 1, further comprising specifying the target position by a facet mirror to be swapped.

17. The method of claim 16, wherein a) comprises determining positions of contact faces provided on a mirror frame of the facet mirror relative to the interfaces provided on the mirror frame.

18. The method of claim 16, further comprising, during or before c), calculating a correction formula for the spacers, wherein applying the correction formula causes the object field to be brought from the calculated actual position to the target position in the field plane.

19. The method of claim 1, wherein a) comprises determining positions of the facets relative to the stops based on the positions of the stops relative to the reference plate and based on the positions of the facets relative to the reference plate.

20. The method of claim 19, wherein a) comprises determining positions of the facets relative to the interfaces based on the positions of the facets relative to the stops and based on the positions of the contact faces relative to the interfaces.

* * * * *